(12) United States Patent
Kitagawa

(10) Patent No.: US 7,554,230 B2
(45) Date of Patent: Jun. 30, 2009

(54) CONTROL CIRCUIT DEVICE FOR MOTOR, METHOD FOR MANUFACTURING THE DEVICE, AND MOTOR HAVING THE DEVICE

(75) Inventor: Takayuki Kitagawa, Toyohashi (JP)

(73) Assignee: Asmo Co., Ltd., Shizuoka-pref. (JP)

( * ) Notice: Subject to any disclaimer, the term of this patent is extended or adjusted under 35 U.S.C. 154(b) by 382 days.

(21) Appl. No.: 11/455,927

(22) Filed: Jun. 20, 2006

(65) Prior Publication Data
US 2007/0007833 A1    Jan. 11, 2007

(30) Foreign Application Priority Data
Jun. 20, 2005    (JP) .............................. 2005-179761

(51) Int. Cl.
*H02K 11/00*    (2006.01)
*H02K 5/22*    (2006.01)
*H02K 9/22*    (2006.01)

(52) U.S. Cl. .................. 310/68 R; 310/71; 310/64; 310/DIG. 3

(58) Field of Classification Search .............. 310/64, 310/71, 67 R, 68
See application file for complete search history.

(56) References Cited

U.S. PATENT DOCUMENTS 5,119,466 A * 6/1992 Suzuki ................. 388/831
5,589,711 A * 12/1996 Sano et al. ............. 257/718
5,969,445 A * 10/1999 Horiuchi et al. ........... 310/64
6,234,842 B1 * 5/2001 Keay et al. ............ 439/620.24
6,297,572 B1 * 10/2001 Sunaga et al. ............ 310/68 R
6,707,185 B2 * 3/2004 Akutsu et al. ............. 310/71
6,776,641 B2 * 8/2004 Hachuda .................. 439/331
6,998,740 B2 * 2/2006 Matsuki .................... 310/64
2002/0012230 A1 * 1/2002 Oishi et al. ............... 361/704

FOREIGN PATENT DOCUMENTS

| JP | A-H05-021670 | 1/1993 |
| JP | A-H05-243439 | 9/1993 |

* cited by examiner

*Primary Examiner*—Burton Mullins
(74) *Attorney, Agent, or Firm*—Posz Law Group, PLC

(57) ABSTRACT

A control circuit device for a motor is provided with a circuit board which has an electrically-conductive terminal for electrically connecting the motor with an exterior connector, a heat radiating unit which is connected with the circuit board to radiate heat generated by the circuit board. The heat radiating unit has a convex member at a surface thereof of the side where the electrically conductive terminal is arranged. The electrically conductive terminal is integrally formed with a concave member for being engaged with the convex member. The convex member is engaged with the concave member. Thus, a heat sink can be readily mounted without increasing the cost.

7 Claims, 8 Drawing Sheets

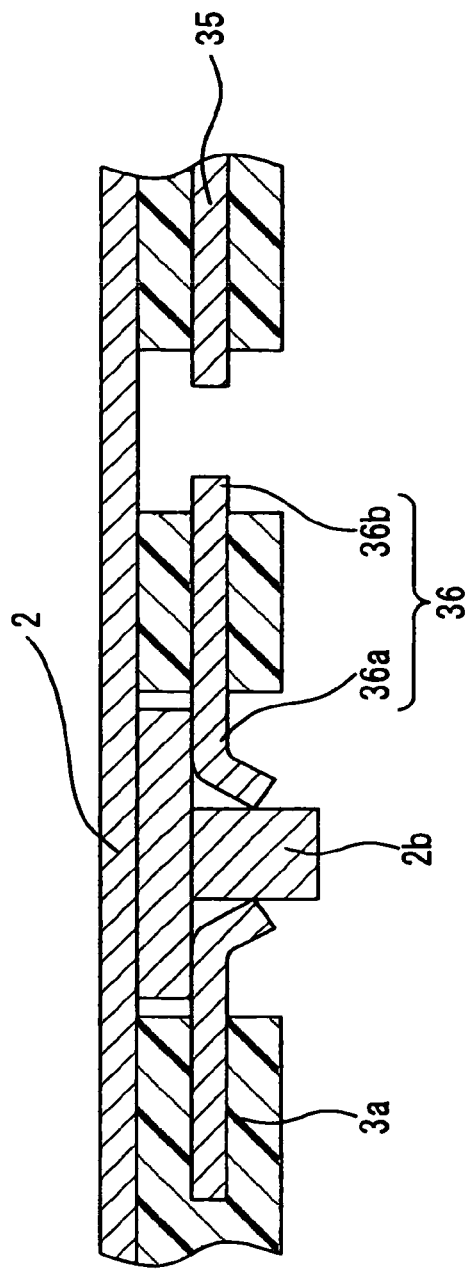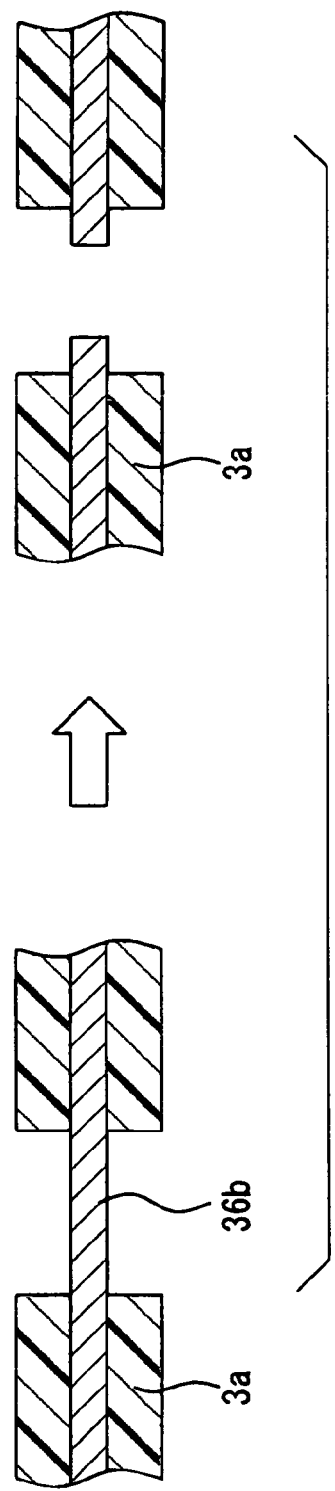
FIG. 7A
FIG. 7B

CONTROL CIRCUIT DEVICE FOR MOTOR, METHOD FOR MANUFACTURING THE DEVICE, AND MOTOR HAVING THE DEVICE

CROSS REFERENCE TO RELATED APPLICATION

This application is based on a Japanese Patent Application No. 2005-179761 filed on Jun. 20, 2005, the disclosure of which is incorporated herein by reference.

FIELD OF THE INVENTION

The present invention relates to a control circuit device for a motor, a method for manufacturing the device, and the motor having the device. More particularly, the present invention relates to a control circuit device for a motor which is provided with a heat sink for radiating heat, a method for manufacturing the device, and the motor having the device.

BACKGROUND OF THE INVENTION

Generally, in the case where an electronic member is used, heat will be generated with the operation of the electronic member. Therefore, the electronic member may have a malfunction due to the generated heat, and is provided concomitantly with a heat radiating member (e.g., heat sink) for radiating the heat generated by the electronic member.

The heat sink has a heat absorbing side through which the heat generated by the object such as the electronic member is absorbed, and a heat radiating side through which the heat having been absorbed is radiated to the exterior. In this case, it is necessary for the electronic member which generates the heat to be connected with (attached to) the heat absorbing side. As disclosed by JP05-243439A and JP05-021670A, various mounting methods are proposed to mount the heat sink to the electronic member.

According to a heat sink mounting construction disclosed in JP05-243439A, the heat sink and the electronic member which generates heat are fixed to each other by screw-engaging, in such a manner that the electronic member and the heat absorbing side of the heat sink are arranged to contact each other. In this case, the heat sink and the electronic member are screw-engaged with each other in such a manner that a coil spring is sandwiched between a nut and the heat sink, thus tightly contacting (stably and evenly) the electronic member with the heat sink.

Moreover, according to the heat sink disclosed in JP05-021670A, a semiconductor chip is directly adhered to a heat absorbing portion of the heat sink through an adhesive.

However, because the heat sink mounting construction disclosed in JP05-243439A is provided with the screw, the cost will increase due to the increase of the number of the components, a tap processing and the like of a screw hole, and the time needed in fastening the screw. Moreover, there may occur a malfunction due to forgetting to fasten the screw.

Furthermore, because the adhesive is used in the heat sink mounting construction disclosed in JP05-021670A, an exfoliation of the adhesive will occur due to the difference between the linear expansion coefficients of the heat sink and the electronic member at the adhering part. Moreover, in this case, it is difficult to verify an adhering strength and the like. Because a process for drying the adhesive is necessary after the adhering, a drying equipment is to be provided and the time is needed in drying so that the cost increases. Furthermore, because the adhesive is electrically insulating, it is difficult to provide an electrical connection for grounding the heat sink. Therefore, the use of an electrically conductive adhesive is also considered. However, in this case, it is necessary to review the selection of the adhesive material and the like to minimize the problem due to the use of the adhesive.

Moreover, in the case where the heat sink is engaged with the electronic member by press-fitting a convex member formed at the heat sink into a concave portion which is directly formed at the electronic member, there may occur facture due to pressure during the press-fitting, facture due to the linear expansion coefficient difference, facture due to creep and the like. Furthermore, in this case, the heat sink cannot be grounded.

Therefore, it is desirable that the heat sink and the electronic member can be connected with each other without increasing the cost and the grounding of the heat sink is capable.

SUMMARY OF THE INVENTION

In view of the above-described disadvantages, it is an object of the present invention to provide a control circuit device for a motor where a heat sink is readily mounted without increasing cost, a method for manufacturing the device, and the motor having the device.

It is another object of the present invention to provide a control circuit device for a motor where a grounding of a heat sink is capable and a floating of a grounding portion is readily capable when the grounding is unnecessary, a method for manufacturing the device, and the motor having the device.

According a control circuit device for a motor of the present invention, the control circuit device has a circuit board which has an electrically conductive terminal for electrically connecting the motor with an exterior connector, and a heat radiating unit which is connected with the circuit board to radiate heat generated by the circuit board. The heat radiating unit has a convex member at a surface thereof of the side where the electrically conductive terminal is arranged. The electrically conductive terminal is integrally formed with a concave member for being engaged with the convex member. The convex member is engaged with the concave member.

Thus, the electrically conductive terminal and a heat sink can be coupled with each other because the concave member integrated with the electrically conductive terminal is engaged with the convex member arranged at the heat sink. Thus, when the heat sink is attached to the electrically conductive terminal, it is unnecessary to perform a screw-fastening. Therefore, the cost increase (due to increase of the number of components, tap processing and the like of screw hole, and time needed in fastening screw) caused by the screw use can be avoided. Furthermore, the malfunction due to forgetting to screw-fasten can be avoided.

Moreover, when the heat sink is mounted to the electrically conductive terminal, it is unnecessary to use an adhesive. Therefore, exfoliation of the adhesive due to the difference between linear expansion coefficients of the heat sink and the electronic member at the adhering part and difficulty in verifying an adhering strength and the like can be avoided. Because a process for drying the adhesive after the adhering is unnecessary, the cost increase due to a supply of a drying equipment and the time needed in drying can be avoided.

In the case where the concave member is directly formed at the electronic member, there may occur facture of the electronic member due to a pressure during press-fitting of the convex member, facture due to a linear expansion coefficient difference, facture due to creep and the like. According to the present invention, because the convex member of the side of the heat sink is press-fitted into the concave portion which is formed concomitantly with the electrically conductive terminal, the factures of the electronic member can be restricted.

Preferably, a grounding portion is formed integrally with the electrically conductive terminal. The concave member is arranged at a position which is electrically continuous with the grounding portion. Therefore, the heat sink can be readily grounded.

In the case where the heat sink and the electrically conductive terminal are connected with each other though the adhesive, it is difficult to provide an electrical connection for grounding the heat sink because the adhesive is electrically insulating. Therefore, the use of an electrically conductive adhesive is also considered. However, in this case, it is necessary to review the selection of the adhesive material and the like to minimize the problem due to the use of the adhesive.

According to the present invention, the concave member which is the coupling portion with the heat sink is constructed as the grounding portion of the electrically conductive terminal, so that the heat sink can be grounded by a coupling of the heat sink. Thus, the heat sink can be readily grounded.

More preferably, the concave member has an engagement portion for being engaged with the convex member, and a connection portion for connecting the engagement portion with the grounding portion. The connection portion is formed to be capable of being disconnected so as to detach an electrical connection between the grounding portion and the engagement portion. Therefore, the selection that the heat sink is not grounded is also capable. That is, the engagement portion which is the coupling portion with the heat sink can be electrically disconnected from the electrically conductive terminal by cutting the connection portion, to be floated from the grounding portion. Therefore, the heat sink is not grounded.

Moreover, generally, the electrically conductive terminal is stamped into a state that the part thereof which should be finally electrically-disconnected is connected for the sake of convenience in performing a resin-molding which is a downstream process. This part which is to be disconnected is cut after the resin-molding. Therefore, if the connection portion is cut in the disconnecting process, an extra process is unnecessary.

More preferably, the heat radiating unit has a heat radiating fin for radiating heat to atmosphere. The heat radiating fin is positioned at an opposite surface of the heat radiating unit to a surface thereof of the side where the electrically conductive terminal is arranged. Thus, the air flowing at a heat radiating surface of the heat sink can be improved, so that heat can be efficiently radiated.

According to a method for manufacturing a control circuit device for a motor of the present invention, the method is provided to manufacture the control circuit device which includes a circuit board and a heat radiating unit connected with the circuit board to radiate heat generated by the circuit board. The circuit board has an electrically conductive terminal for electrically connecting the motor with an exterior connector. The method includes a stamping process for stamping a piece of electrically conductive plate-shaped material to construct the electrically conductive terminal, a molding process for performing a resin-molding at the electrically conductive terminal, and a nonconducting-part constructing process for removing an unwanted portion of the electrically conductive terminal having been resin-molded to construct the circuit board. In the stamping process, a concave member is integrally formed by stamping with the electrically conductive terminal. The concave member is engaged with a convex member arranged at the heat radiating unit.

Thus, in the stamping of the electrically conductive terminal, the concave member which is engaged with the convex member formed at the heat sink can be simultaneously formed so that a process for manufacturing the concave member can be omitted.

Preferably, the concave member is formed integrally with a grounding portion of the electrically conductive terminal. Thus, the construction for grounding the heat sink can be simultaneously manufactured in the process for stamping the electrically conductive terminal.

More preferably, in the stamping process, the concave member is stamped from a remainder part of the electrically conductive plate-shaped material from which an electrically conductive portion of the electrically conductive terminal is stamped. Thus, the cost for manufacturing the concave member can be reduced.

Generally, the remainder part of the electrically conductive plate-shaped material which is stamped to construct the electrically conductive terminal is discarded. Thus, the cost can be restricted because the concave member is constructed of the part to be discarded.

According to the present invention, the electrically conductive terminal and the heat sink can be coupled with each other because the concave member integrated with the electrically conductive terminal is engaged with the convex member arranged at the heat sink. Thus, when the heat sink is attached to the electrically conductive terminal, it is unnecessary to perform the screw-fastening. Therefore, the cost increase (due to increase of the number of components, tap processing and the like of screw hole, and time needed in fastening screw) caused by the screw use can be avoided. The malfunction due to forgetting to screw-fasten can be also avoided.

Moreover, when the heat sink is mounted to the electrically conductive terminal, it is unnecessary to use the adhesive. Therefore, the exfoliation of the adhesive due to the difference between the linear expansion coefficients of the heat sink and the electronic member at the adhering part and the difficulty in verifying the adhering strength and the like can be avoided. Because the process for drying the adhesive after the adhering is unnecessary, the cost increase due to the supply of the drying equipment and the time needed in drying can be avoided.

In the case where the concave member is directly formed at the electronic member, there may occur the facture of the electronic member due to the pressure during the press-fitting of the convex member, the facture due to the linear expansion coefficient difference, the facture due to the creep and the like. According to the present invention, because the convex member of the side of the heat sink is press-fitted into the concave portion which is formed concomitantly with the electrically conductive terminal, the factures of the electronic member can be restricted.

Because the grounding portion is formed integrally with the electrically conductive terminal and the concave member is arranged at the position which is electrically continuous with the grounding portion, the heat sink can be readily grounded by only connecting the convex member of the heat sink with the concave member.

More preferably, the concave member has the engagement portion for being engaged with the convex member, and the connection portion for connecting the engagement portion with the grounding portion. The electrical connection between the grounding portion and the engagement portion can be detached by cutting the connection portion. Therefore, the selection that the heat sink is not grounded is also capable. That is, the engagement portion which is the coupling portion with the heat sink can be electrically disconnected from the electrically conductive terminal by cutting the connection portion, to be floated from the grounding portion. Thus, the heat sink is not grounded.

Moreover, generally, the electrically conductive terminal is stamped into a state that the part thereof which should be finally electrically-disconnected is joined for the sake of convenience in performing the resin-molding which is the downstream process, and the part which is to be disconnected is cut after the resin-molding. Thus, the extra process is unnecessary, in the case where the connecting portion is cut in the disconnecting process.

Furthermore, the concave member is constructed by stamping the remainder of the electrically conductive plate-shaped material which is stamped to construct the electrically conductive terminal. That is, the concave member is constructed of the part which is to be discarded, thus restricting the cost.

BRIEF DESCRIPTION OF THE DRAWINGS

FIG. 7A is a sectional view showing a state that a coupling portion between the heat sink and the circuit board has been electrically floated according to the first embodiment, and FIG. 7B is a sectional view showing a disconnecting of a connection portion of the concave member;

DETAILED DESCRIPTION OF THE PREFERRED EMBODIMENTS

First Embodiment

A first embodiment of the present invention will be described with reference to drawings. It is to be noted that various changes and modifications will become apparent for following members and arrangements and the like, which do not limit the present invention.

Figure 1:
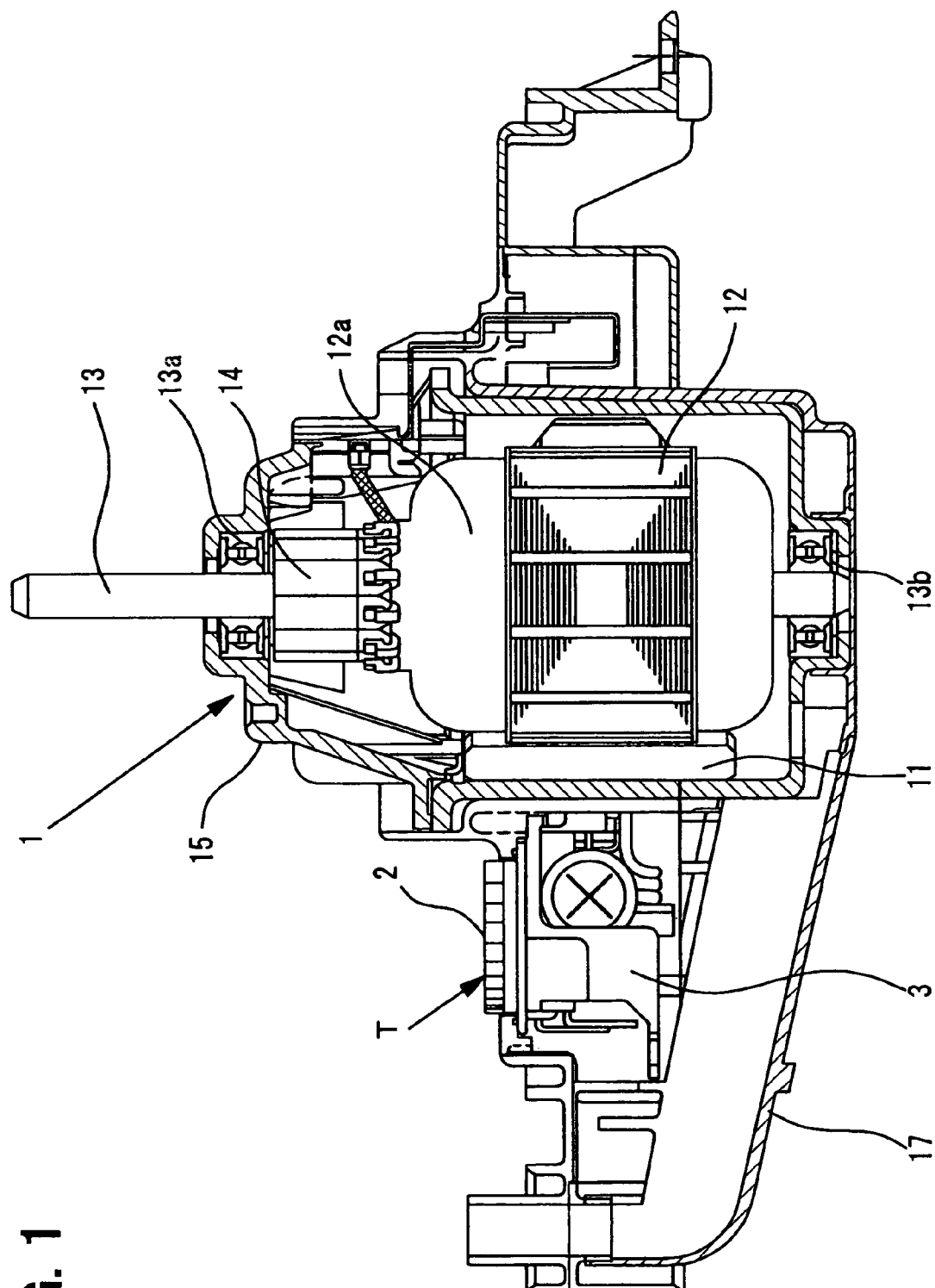
FIG. 1 is a partially sectional view of a motor having a control circuit device according to a first embodiment of the present invention.

Referring to FIG. 1, a construction of a motor 1 having a control circuit device T will be described. In this embodiment, the motor 1 which is well-known motor has a stator 11, a rotor 12 to which a winding 12a is wrapped, a rotation shaft 13 which is a rotation center axis of the rotor 12, bearings 13a and 13b for bearing the rotation shaft 13, a commutator 14 arranged at the side of one end of the rotor 12, and a brush apparatus (not shown). The motor 1 is accommodated in a motor case 15.

Figure 2:
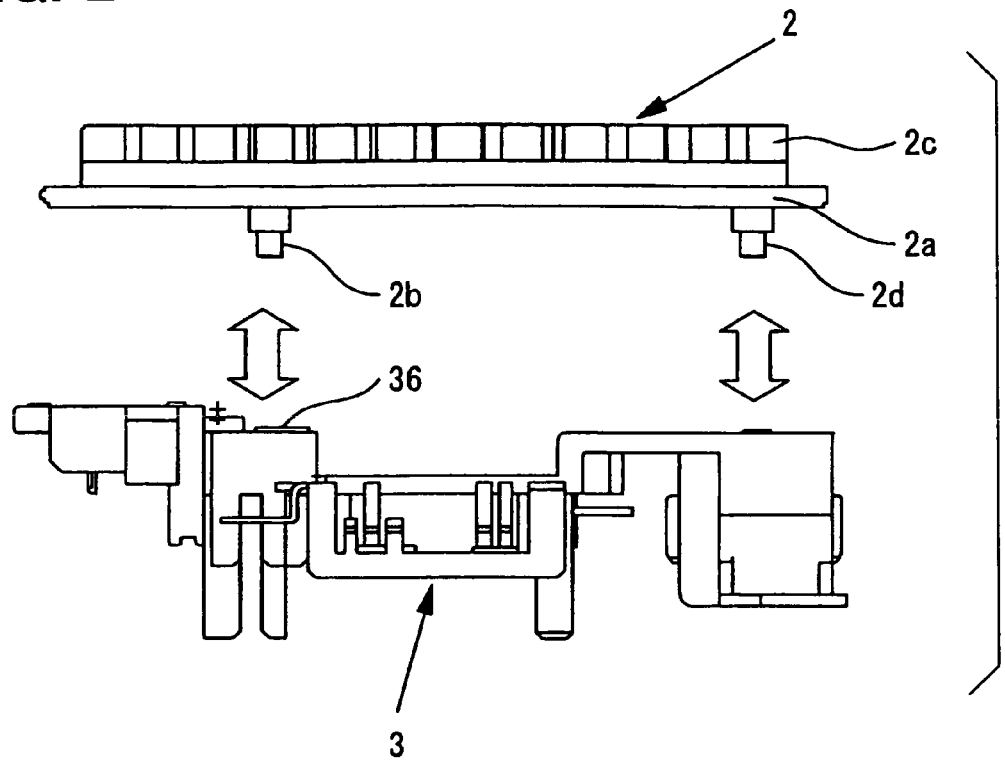
FIG. 2 is a schematic view showing a coupling state between a circuit board and a heat sink according to the first embodiment.

Moreover, a pipe 17 for cooling is connected with an end of the motor case 15. The end is positioned at the side of the bearing 13b. When the motor operates, cooling air will be introduced into the motor case 15 through the cooling pipe 17. Moreover, the control circuit device T is arranged at the upper side of the cooling pipe 17. As shown in FIG. 2, the control circuit device T of this embodiment has a heat sink 2 and a circuit board 3.

According to this embodiment, the heat sink 2 which is a well-known fin-mounted type heat sink is attached to an electronic member or the like which generates heat due to operation, to radiate the generated heat to atmosphere. In this case, the heat sink 2 is mounted to the circuit board 3 to radiate the heat generated by the circuit board 3 to atmosphere.

A connection convex member 2b is arranged at a circuit-board mounting surface 2a of the heat sink 2. The connection convex member 2b is engaged with a connection concave member 36 (described later) formed at the circuit board 3, so that the heat sink 2 is attached to the circuit board 3. Moreover, the connection convex member 2b is arranged at a position corresponding to that of the connection concave member 36.

According to the first embodiment, a second connection convex member 2d is further provided for the connection. Alternatively, the second connection convex member 2d can be also omitted. More alternatively, the plurality of second connection convex member 2d can be also provided. The forming position of the second connection convex member 2d is not limited, on condition that the heat sink 2 can be stably attached to the circuit board 3.

The heat sink 2 is further provided with a heat-radiating fin 2c at a surface thereof which is positioned at the opposite side to the circuit-board mounting surface 2a. The heat-radiating fin 2c radiates the heat generated by the circuit board 3 to atmosphere through the heat-radiating surface of the heat sink 2, so that the generated heat can be efficiently diffused through the heat-radiating surface.

Next, the circuit board 3 will be described with reference to FIGS. 3 and 4.

According to this embodiment, the circuit board 3 is formed by resin-molding an electrically conductive terminal 30. By the resin-molding, the circuit board 3 is formed to have a resin layer 3a which is integrated with the periphery of the electrically conductive terminal 30.

Figure 3:
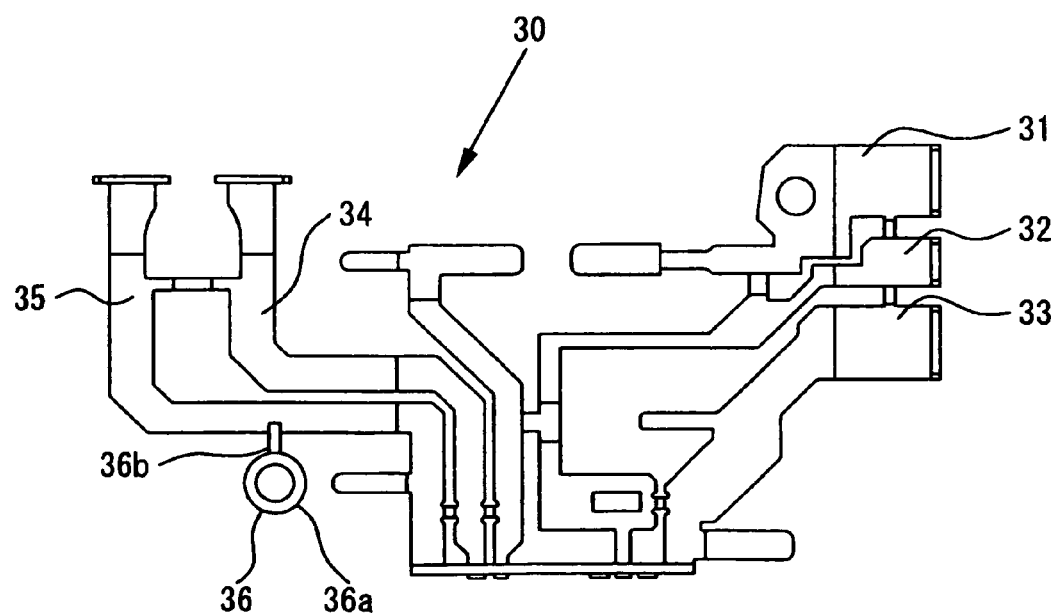
FIG. 3 is a schematic view showing an electrically conductive terminal according to the first embodiment.
Figure 4:
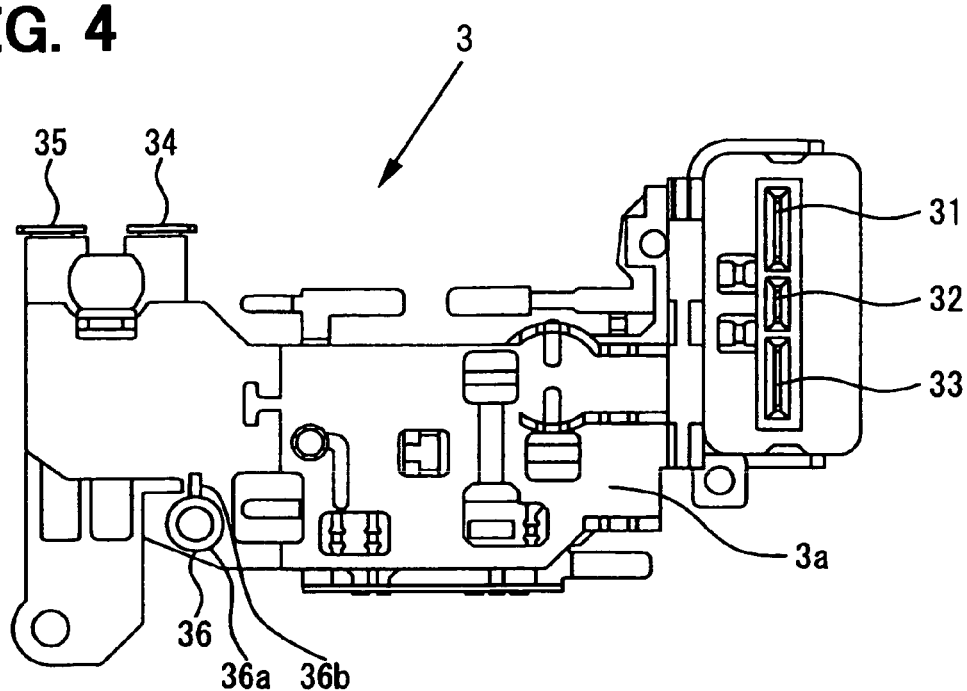
FIG. 4 is a schematic view showing the circuit board which has been resin-molded according to the first embodiment.

FIG. 3 shows the electrically conductive terminal 30. FIG. 4 shows the circuit board 3 having the electrically conductive terminal 30 having been resin-molded. In this embodiment, the electrically conductive terminal 30 is made of an electrically conductive metal having a predetermined shape, as shown in FIG. 3.

The conductive terminal 30 is formed by stamping a piece of electrically conductive metal plate into a designated shape and then by bending predetermined portions, to be provided with a predetermined shape. The electrically conductive terminal 30 is used to electrically connect the motor and the control circuit, and includes multiple terminals for inputting and multiple terminals for outputting.

The electrically conductive terminal 30 according to this embodiment is provided with a plus-input terminal 31 connected with a connector of the side of a vehicle chassis (not shown), a common terminal 32, and a minus-input terminal 33. The terminals 31-33 are arranged at the one end side (right side of FIG. 3) of the electrically conductive terminal 30 and sequentially arranged in a line from the upper side (upper side of FIG. 3).

Moreover, the electrically conductive terminal 30 has a plus-output terminal 34 which is connected with the brush apparatus (not shown) and a minus-output terminal 35, which are provided at the other end side (left side of FIG. 3) of the electrically conductive terminal 30 and arranged in a line in the horizontal direction (left-right direction of FIG. 3).

The connection concave member 36 is formed integrally with the minus-output terminal 35 of the electrically conductive terminal 30, so that the connection convex member 2b formed at the heat sink 2 can be press-fitted into the connection concave member 36. In this case, the connection concave member 36 has an engagement portion 36a and a connection portion 36b. The engagement portion 36a has a substantial annular shape, and is engaged with the connection convex member 2b. The connection portion 36b has a substantially rectangular plate shape, and connects the engagement portion 36a with the minus-output terminal 35 which is a grounding portion.

Because the grounding portion is integrated with the minus-output terminal 35, the fixing of the heat sink 2 doubles as the grounding of the heat sink 2. Thus, the assembling labor can be reduced.

The number of the connection concave members 36 can differ according to the size and the shape of the electrically conductive terminal 30 and the circuit-board mounting surface 2. In this case, at least the one connection concave member 36 is arranged at the position which is connected with the ground, that is, the position which is electrically connected with the minus-output terminal 35.

The connection concave member 36 is constructed of a remainder part (i.e., part to be discarded) in stamping the electrically conductive terminal 30. Thus, the cost for manufacturing the connection concave member 36 is not needed. The electrically conductive terminal 30 shown in FIG. 3 is resin-molded to form the circuit board 3 shown in FIG. 4. During the resin-molding, the molding is performed in such a manner that the resin layer 3a is not arranged at the position where a part (where connection convex member 2b is to be engaged) of the engagement portion 36a is arranged and the position where a part of the connection portion 36b is arranged. That is, as shown in FIG. 4, the resin layer 3a which is arranged at the circuit board 3 is not formed at the position thereof where the part (with which connection convex member 2b is to be engaged) of the engagement portion 36a is disposed and the position thereof where the part of the connection portion 36b is disposed.

Next, the shape of the engagement portion 36a of the connection concave member 36 will be example-described with reference to FIGS. 5A and 5B. The engagement portion 36a can be also provided with a shape other than that described in this embodiment, on condition that the engagement portion 36a can stably fix the connection convex member 2b.

Figure 5A:
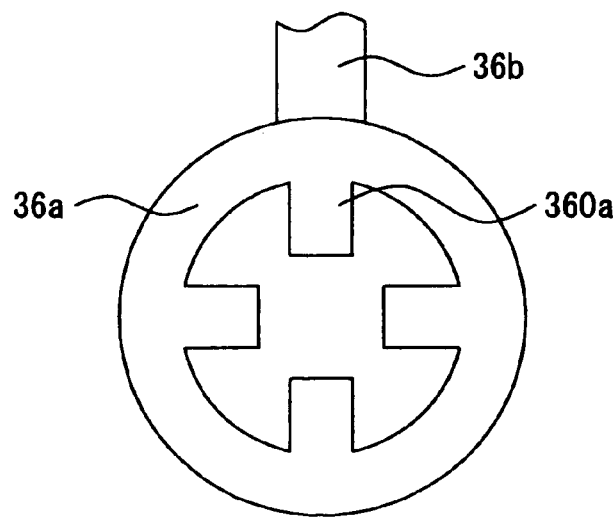
FIG. 5A is a schematic view showing a shape of a concave member formed at the circuit board according to the first embodiment.

For example, the engagement portion 36a shown in FIG. 5A has a substantial annular shape and is provided with four protrusion portions 360a, each of which has a substantial square shape. The protrusion portions 360a protrude to the diametrical-direction inner side of the engagement portion 36a at intervals of substantial 90° (in central angle terms). The distance between the two protrusion portions 360a which face each other is slightly smaller than the diameter of the connection convex member 2b. Thus, when the connection convex member 2b is press-fitted into the engagement portion 36a, the protrusion portion 360a will be distorted in the pressure exertion direction. The connection convex member 2b having been press-fitted is pressed toward the center direction by a restoring force of the protrusion portion 360a having been distorted. Because the protrusion portions 360a are arranged at intervals of substantial 90° (in central angle terms), the connection convex member 2b is evenly pressed toward the center direction by the multiple protrusion portions 360a to be substantially fixed.

Figure 5B:
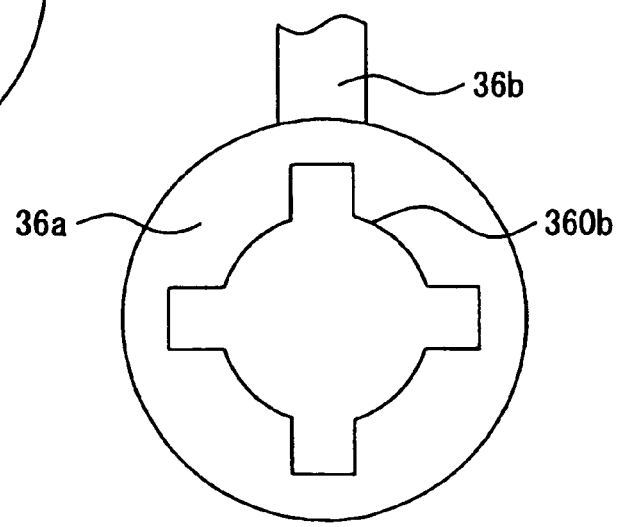
FIG. 5B is a schematic view showing another shape of the concave member formed at the circuit board according to the first embodiment.

Alternatively, the engagement portion 36a can be also provided with the shape shown in FIG. 5B. In this case, the engagement portion 36a has a substantial annular shape and is notched in a direction away from the center of the engagement portion 36a at intervals of substantial 90° (in central angle terms). Each notch portion has a substantial square shape. Thus, the engagement portion 36a is provided with protrusion portions 360b, each of which is formed between the adjacent notch portions. The distance between the two protrusion portions 360b which face each other is slightly smaller than the diameter of the connection convex member 2b. Thus, the protrusion portion 360b will have the function similar to the protrusion portion 360a shown in FIG. 5A, to fix the connection convex member 2b having been press-fitted into the engagement portion 36a.

Figure 6A:
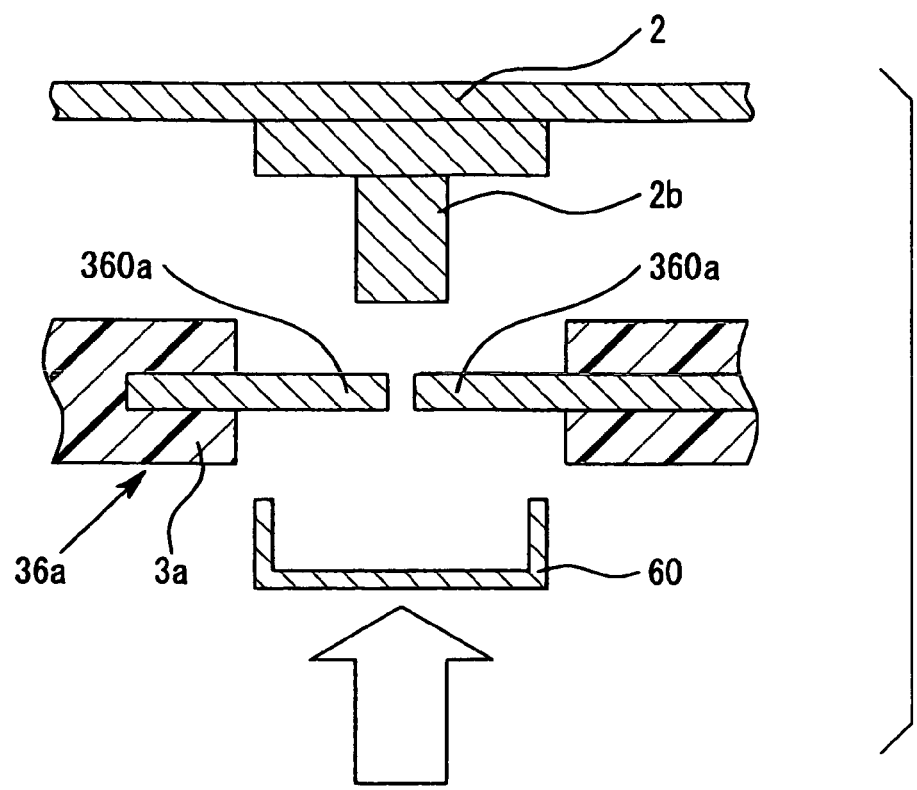
FIG. 6A is a sectional view showing a press-fitting of a convex member formed at the heat sink into the concave member formed at the circuit board according to the first embodiment.
Figure 6B:
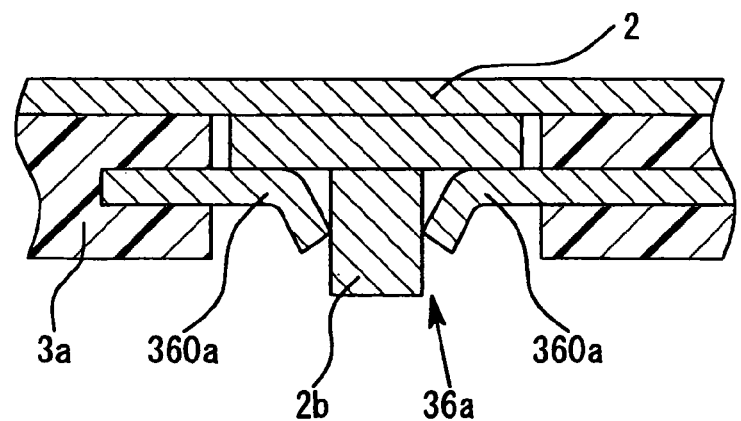
FIG. 6B is a sectional view showing a state that this convex member has been press-fitting therein.

FIGS. 6A and 6B shows the state when the connection convex member 2b is press-fitted into the engagement portion 36a. During the resin-molding, the molding is performed in such a manner that the resin layer 3a is not provided at the position where the part (with which the connection convex member 2b is engaged) of the engagement portion 36a is arranged, as shown in FIGS. 6A and 6B. That is, the resin layer 3a is not formed at the part of the engagement portion 36a where the connection convex member 2b is engaged.

As shown in FIG. 6A, when the connection convex member 2b is press-fitted into the engagement portion 36a, a jig 60 is used to restrict a deformation due to the application of the pressure. The jig 60 having a substantial cylinder shape is bottomed and provided with a diameter which is substantially equal to that of the engagement portion 36a. The connection convex member 2b is press-fitted into the engagement portion 36a, in such a manner that the opening-side end of the jig 60 is fixed to a back surface of the engagement portion 36a and the engagement portion 36a is supported by the jig 60 from the side of the back surface of the engagement portion 36a. The back surface of the engagement portion 36a is opposite to the surface thereof of the side where the connection convex member 2b is press-fitted. That is, the back surface of the engagement portion 36a is a surface thereof at the downstream side in the application direction of the engagement pressure.

In this case, as described above, because the resin layer 3a is not formed at the position where the part (with which connection convex member 2b is engaged) of the engagement portion 36a is arranged, the connection convex member 2b can be readily press-fitted. FIG. 6B shows the state where the connection convex member 2b has been press-fitted and the jig 60 has been removed.

Thus, the protrusion portion 360a is distorted in the application direction of the pressure. The connection convex member 2b having been press-fitted is pressed to the center direction by the restoring force of the protrusion portion 360a having been distorted, to be substantially fixed.

Next, a method for detaching the engagement portion 36a of the connection concave member 36 from the ground will be described with reference to FIGS. 7A and 7B.

As shown in FIGS. 7A and 7B, during the resin-molding, the molding is performed in such a manner that the resin layer 3a is not provided at the position where the part (with which connection convex member 2b is engaged) of the engagement portion 36a is arranged and the position where the part of the connection portion 36b is arranged. That is, as shown in FIGS. 7A and 7B, the circuit board 3 is provided with the resin layer 3a, which is not formed at the positions where the part (with which connection convex member 2b is engaged) of the engagement portion 36a and the part of the connection portion 36b are arranged.

In the state where the connection convex member 2b has been press-fitted into the engagement portion 36a, the engagement portion 36a is electrically connected with the minus-output terminal 35 through the connection portion 36b.

As described above, the minus-output terminal 35 is grounded. In this case, the heat sink 2 is grounded through the connection convex member 2b and the connection concave member 36. As shown in FIG. 7B, when the connection portion 36b is disconnected, the engagement portion 36a of the connection concave member 36 will be electrically detached from the minus-output terminal 35.

In this case, as described above, because the resin layer 3a is not formed at the position where the part of the connection portion 36b is arranged, the disconnection of the connection portion 36b can be performed at the position where the resin layer 3a is not formed.

FIG. 7A shows the state that the connection portion 36b has been disconnected. Thus, the engagement portion 36a and the heat sink 2 which is connected to the engagement portion 36a through the connection convex member 2b can be electrically floated. Thus, it becomes possible for the heat sink 2 not to be grounded.

Generally, it is said that the grounding of the heat sink 2 is effective to restrict the generation of radio noise. That is, it is said that the grounding of a metal case is effective to trap energy (which is emitted as electromagnetic wave) in the metal case such as the heat sink 2 to restrict the leakage of the energy.

However, contrary to theory, there often exists in practice the case where the radio noise is caused due to the grounding. For example, because the heat sink 2 is grounded, the heat sink 2 will act as an antenna so that noise is leaked into the ground.

In this case, according to the first embodiment, the circuit board 3 is constructed in such a manner that the selection that the heat sink 2 is floated without being grounded is capable. Moreover, the resin-molding is performed in a process for manufacturing the circuit board 3. Before the resin-molding, the electrically conductive terminal 30 becomes the state that the part thereof which will be finally electrically-disconnected is connected. Therefore, after the resin-molding, a disconnecting process is performed to cut the part which is to be electrically disconnected.

Accordingly, in the case where it is desirable to float the engagement portion 36a, the floating of the engagement portion 36a can be realized by simultaneously cutting the connection portion 36b in the disconnecting process. Thus, the process and the cost do not increase.

Figure 8:
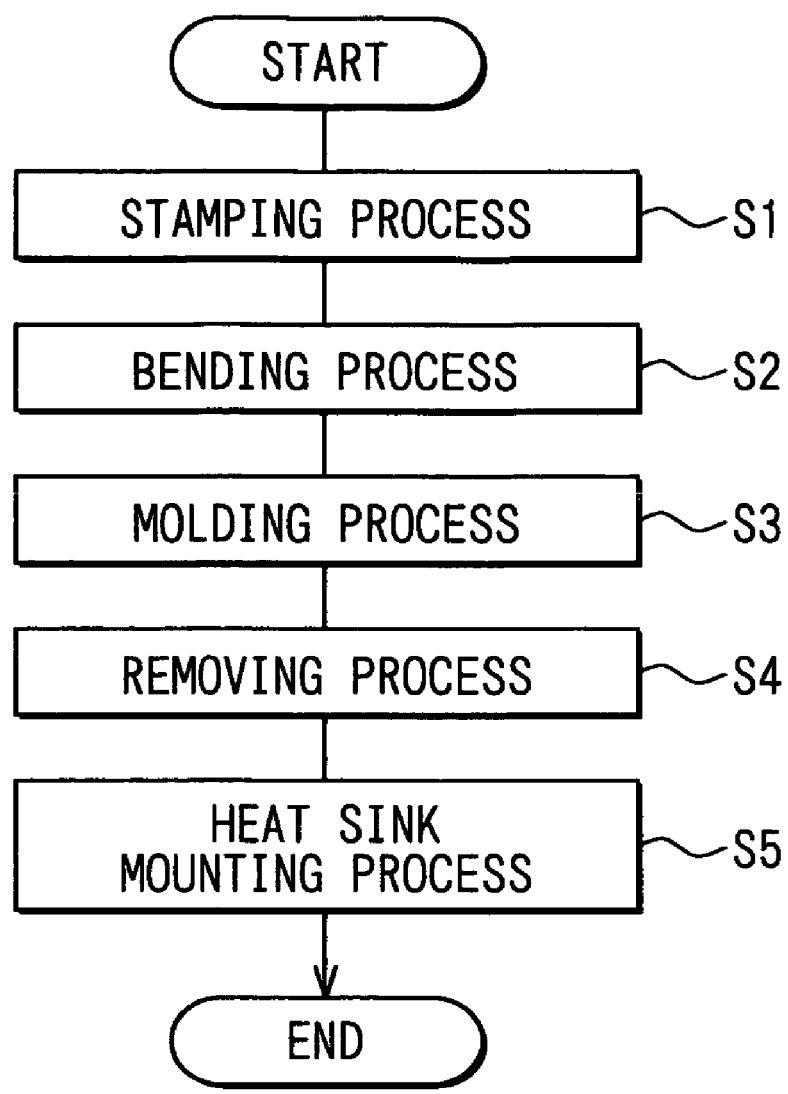
FIG. 8 is a flow diagram showing a manufacture process of the control circuit device according to the first embodiment.

Next, a manufacturing method of the control circuit device according to this embodiment will be described with reference to FIG. 8.

At step S1, a stamping process is performed. In this case, a piece of electrically-conductive plate-shaped member is stamped into a shape which is an antetype (i.e., primary type) of the electrically conductive terminal 30.

After the stamping process is performed, a bending process is performed at step S2. Alternatively, the stamping process of step S1 and the bending process of step S2 can be also performed simultaneously.

At step S2, the predetermined portions of the antetype of the electrically conductive terminal 30 which is two-dimensionally stamped at step S1 are bent, so that the electrically conductive terminal 30 having a three-dimensional construction is formed. After the bending process is performed, a molding process is performed at step S3.

At step S3, the electrically conductive terminal 30 formed at step S2 is set in a molding die and the resin-molding is performed. After the molding process is performed at step S3, a removing process is performed at step S4 as a nonconducting-part constructing process. At step S4, a predestined portion of the electrically conductive terminal 30 which has been resin-molded at step S3 is cut. Thus, the circuit board 3 is constructed.

The electrically conductive terminal 30 having been manufactured at step S2 is the state that the portion thereof which is to be finally electrically disconnected is connected for the sake of convenience in performing the resin-molding. Therefore, after the molding process at step S3 is finished, the portion which is to be electrically disconnected is cut at step S4. After step S4 is performed, a heat sink mounting process is performed at step S5. At step S5, the connection convex member 2b formed at the heat sink 2 is press-fitted into the connection concave member 36 formed at the electrically conductive terminal 30, so that the heat sink 2 is attached to the circuit board 3 to construct the control circuit device T.

Second Embodiment

A second embodiment will be described with reference to FIGS. 9 and 10. According to the second embodiment, the connection concave portion is made as a separate component. Considering Galvanic corrosion may occur due to the ionizing-tendency difference between the material of the heat sink 2 and the material of the electrically conductive terminal 30, the connection concave portion is to be made as the component separate from the electrically conductive terminal 30.

Figure 9:
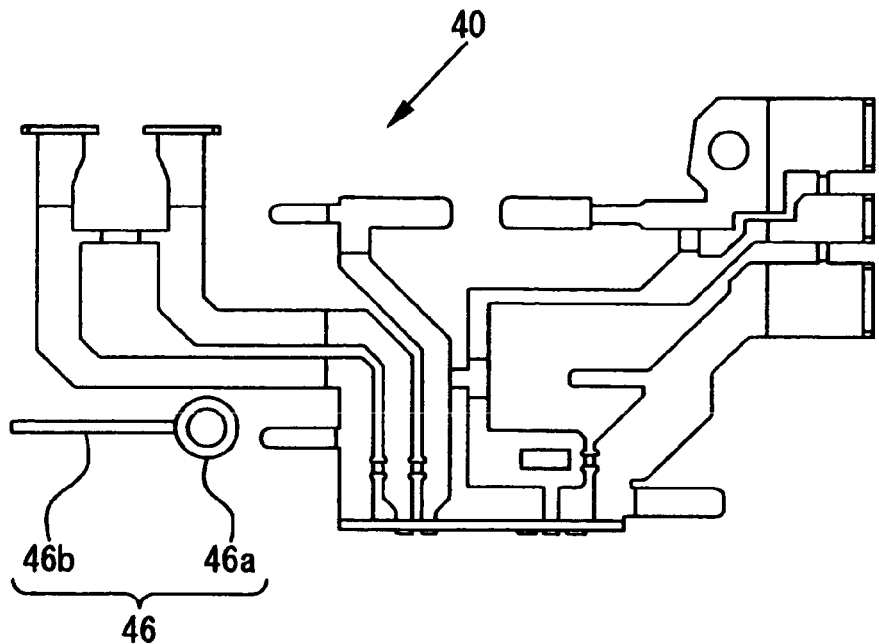
FIG. 9 is a schematic view showing a second electrically conductive terminal according to a second embodiment of the present invention.

In the second embodiment, as shown in FIG. 9, a second connection concave member 46 is made as the component separate from a second electrically conductive terminal 40, and resin-molded along with the second electrically conductive terminal 40. The second electrically conductive terminal 40 has a construction which is the same with the electrically conductive terminal 30 of the above-described embodiment, except for that the second electrically conductive terminal 40 is not provided with the connection concave member 36.

Moreover, the second connection concave member 46 is made of the same metal material as the heat sink 2, and provided with a second engagement portion 46a and a second connection portion 46b. The second engagement portion 46a has the same shape with the engagement portion 36a of the above-described embodiment. The second connection portion 46b is not connected with the second electrically conductive terminal 40.

Figure 10:
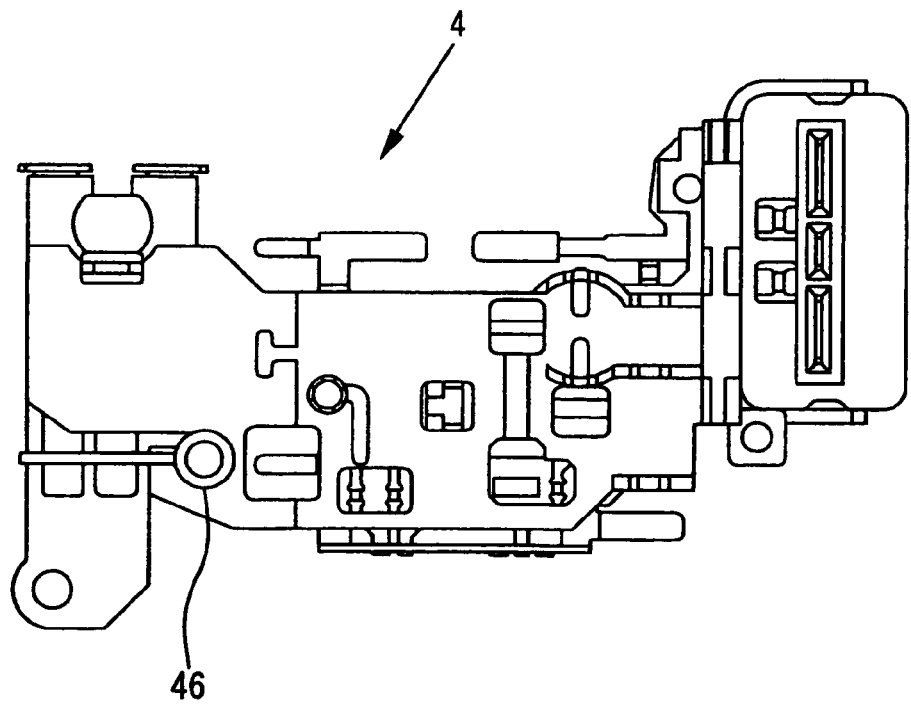
FIG. 10 is a schematic view showing a second circuit board according to the second embodiment.

The second electrically conductive terminal 40 and the connection concave member 46 will be resin-molded to construct a second circuit board 4 shown in FIG. 10. Because the second circuit board 4 is provided with the second connection concave member 46 which is made of the same metal material as the heat sink 2, the Galvanic corrosion can be restricted.

Third Embodiment

A third embodiment will be described with reference to FIGS. 11 and 12. In the second embodiment, the connection concave portion is made as the separate component. In this case, because the heat sink 2 is electrically floated, the heat sink 2 cannot be grounded. According to the third embodiment, a construction is provided so that the heat sink 2 can be grounded.

A third electrically conductive terminal 50 has a substantially same construction as the electrically conductive terminal 30, and is provided with a connection flake 57 for connecting a third connection concave member 56 with a third minus-output terminal 350 which is grounded.

The side of one end of the connection flake 57 is connected with the third minus-output terminal 350. The third connection concave member 56 has a third engagement portion 56a and a third connection portion 56b. The third engagement portion 56a has the same shape as the engagement portion 36a of the above-described embodiment. Furthermore, the third connection portion 56b is resistance-welded to the free end side of the connection flake 57. That is, the third connection concave member 56 is connected with the third minus-output terminal 350 of the third electrically conductive terminal 50 through the connection flake 57.

Figure 11:
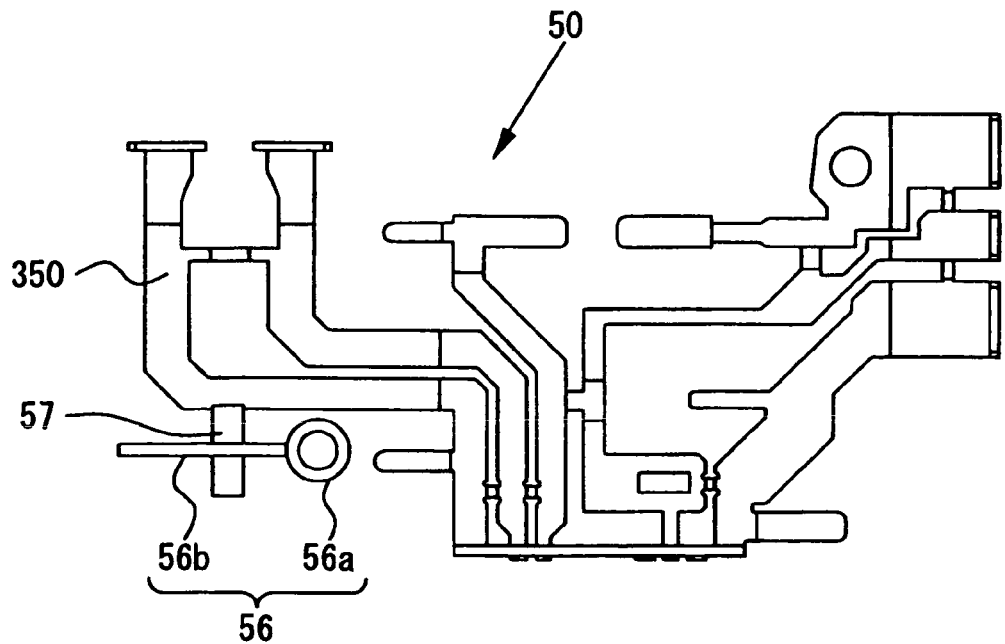
FIG. 11 is a schematic view showing a third electrically conductive terminal according to a third embodiment of the present invention.
Figure 12:
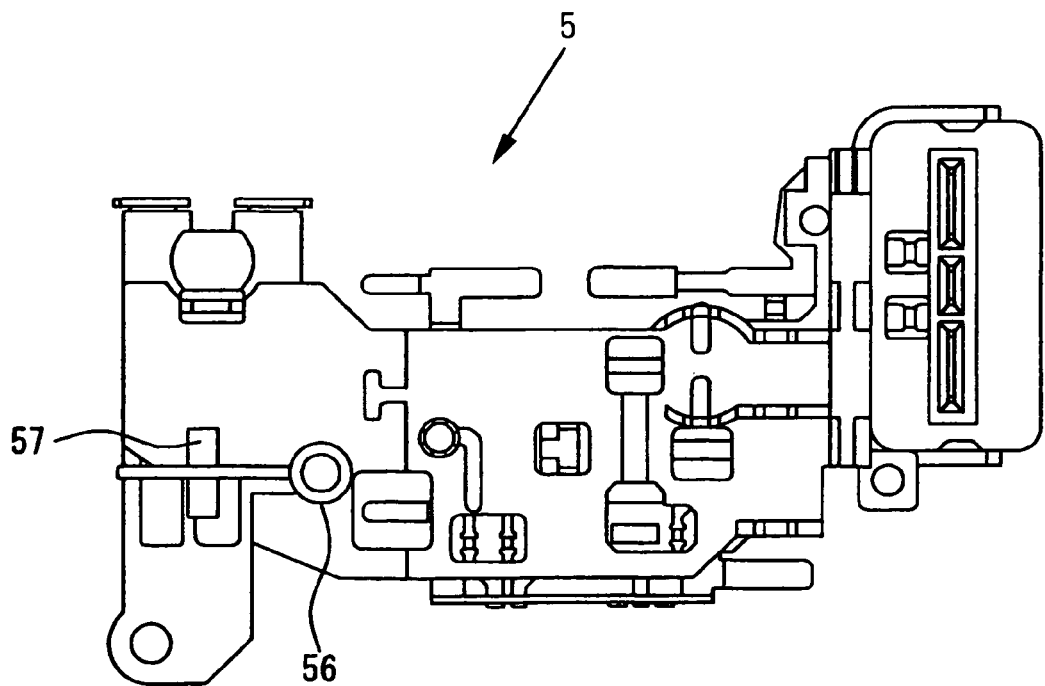
FIG. 12 is a schematic view showing a third circuit board according to the third embodiment.

According to this embodiment, as showing in FIG. 11, the third connection concave member 56 which is made as the separate component is connected with the third minus-output terminal 350 through the connection flake 57, and is resin-molded. The resin-molding is performed to construct a third circuit board 5 shown in FIG. 12.

Because the third circuit board 5 is provided with the third connection concave member 56 which is made of the same metal material as the heat sink 2, the Galvanic corrosion can be restricted. Moreover, because the third connection concave member 56 is connected with the third minus-output terminal 350 (which is grounded) through the connection flake 57, the heat sink 2 can be grounded. Furthermore, the third electrically conductive terminal 50 and the heat sink 2 can be restricted from causing the Galvanic corrosion.

What is claimed is:

1. A control circuit device for a motor, the control circuit device comprising:

a circuit board which has an electrically conductive terminal for electrically connecting the motor with an exterior connector; and a heat radiating unit which is connected with the circuit board to radiate heat generated by the circuit board, wherein:

the heat radiating unit has a convex member at a surface thereof on the side where the electrically conductive terminal is arranged;

the electrically conductive terminal has a concave member for being engaged with the convex member, the concave member being integrated with the electrically conductive terminal;

the convex member is engaged with the concave member; and the electrically conductive terminal has a grounding portion which is integrated with the electrically conductive terminal; and the concave member is constructed at a position which is electrically continuous with the grounding portion.

2. The control circuit device for the motor according to claim 1, wherein:

the concave member has an engagement portion for being engaged with the convex member, and a connection portion for connecting the engagement portion with the grounding portion; and the connection portion is formed to be capable of being disconnected so as to detach an electrical connection between the grounding portion and the engagement portion.

3. The control circuit device for the motor according to claim 1, wherein the heat radiating unit has a heat radiating fin for radiating heat to atmosphere, the heat radiating fin being positioned at an opposite surface of the heat radiating unit to a surface thereof on the side where the electrically conductive terminal is arranged.

4. A motor having the control circuit device according to claim 1.

5. A motor having the control circuit device according to claim 2.

6. A motor having the control circuit device according to claim 3.

7. The control circuit device for the motor according to claim 1, wherein:

the electrically conductive terminal includes a plus output terminal and a minus output terminal; and the concave member and the grounding portion are formed integrally with the minus output terminal.

* * * * *